United States Patent
Park et al.

[11] Patent Number: 6,150,713
[45] Date of Patent: Nov. 21, 2000

[54] LEAD FRAME FOR SEMICONDUCTOR PACKAGE AND LEAD FRAME PLATING METHOD

[75] Inventors: Se-chul Park; Kyu-han Lee; Ju-bong Kim; Sung-il Kang; Dong-il Shin; Bae-soon Jang, all of Changwon, Rep. of Korea

[73] Assignee: Samsung Aerospace Industries, Ltd., Kyongsangnam-Do, Rep. of Korea

[21] Appl. No.: 09/260,471

[22] Filed: Mar. 2, 1999

[30] Foreign Application Priority Data

Apr. 18, 1998 [KR] Rep. of Korea ............... 98-13927

[51] Int. Cl.[7] ................................ H01L 23/495
[52] U.S. Cl. ..................... 257/677; 257/769; 257/762
[58] Field of Search ................... 257/677, 762, 257/769; 438/111, 123

[56] References Cited

U.S. PATENT DOCUMENTS

| | | |
|---|---|---|
| 5,510,197 | 4/1996 | Takahashi et al. . |
| 5,650,661 | 7/1997 | Mathew . |
| 5,760,468 | 6/1998 | King et al. . |
| 5,767,574 | 6/1998 | Kim et al. . |
| 5,801,436 | 9/1998 | Serizawa . |
| 5,914,532 | 6/1999 | Akagi et al. . |
| 5,977,620 | 11/1999 | Kim et al. . |
| 5,994,767 | 11/1999 | Huang et al. . |
| 6,034,422 | 3/2000 | Horita et al. . |
| 6,037,653 | 3/2000 | Kinm et al. . |

FOREIGN PATENT DOCUMENTS

| | | |
|---|---|---|
| 7-326702 | 12/1995 | Japan . |
| 9-29865 | 11/1997 | Japan . |

*Primary Examiner*—Sheila V. Clark
*Attorney, Agent, or Firm*—Finnegan, Henderson, Farabow, Garrett & Dunner, L.L.P.

[57] ABSTRACT

A lead frame plating method including the steps of (a) forming an intermediate layer on the upper surface of a metal substrate, (b) submerging the metal substrate into a plating solution, and (c) forming a passive layer to a thickness of 0.01 to 1.5 microinches on the upper surface of the intermediate layer by applying a modulated current to the plating solution and the metal substrate.

17 Claims, 8 Drawing Sheets

LEAD FRAME FOR SEMICONDUCTOR PACKAGE AND LEAD FRAME PLATING METHOD

BACKGROUND OF THE INVENTION

1. Field of the Invention

The present invention relates to a lead frame, and more particularly, to a semiconductor package lead frame in which a protection layer for protecting an intermediate layer deposited on the upper surface of a metal substrate is improved in applying a preplating method (pre-plated frame), and a lead frame plating method.

2. Description of the Related Art

Like semiconductor chips, a lead frame is essential for a semiconductor package and acts as both a conductive wire for connecting the chip of a semiconductor package to an external circuit and a support for supporting the semiconductor chip. Such a semiconductor lead frame has various shapes according to high-density and high-integration of a semiconductor chip and a substrate mounting method.

A basic semiconductor lead frame is comprised of an inner lead portion which is wire-bonded to a pad portion for mounting a chip being a semiconductor memory element and maintaining the mounted chip in a static state, and an external lead portion for connecting to an external circuit. A semiconductor lead frame having such a configuration is usually manufactured by stamping or etching.

Lead frames manufactured by the two methods are wire-bonded to a chip safely seated on the pad portion. The chip and the inner lead portion of the lead frame, which have been wire-bonded to each other, are molded by a mold compound to accomplish a semiconductor package.

During the manufacture of this semiconductor package, the cross-sections of the pad portion and the inner lead portion of the lead frame are plated with a metal such as silver in order to provide a good wire bond property between the chip and the inner lead portion of the lead frame and good characteristics of the pad portion. After a resin passivation film is molded, a predetermined area of the outer lead portion is soldered, i.e., plated with tin—lead (Sn—Pb) to improve solderability for mounting a substrate.

However, this process necessarily requires a wet-etching process after the resin passivation film molding process, which degrades the reliability of completed products.

In order to solve the above problem, a preplating method (pre-plated frame) has been proposed for pre-coating a solder-wettable material and forming a protection layer for protecting the material before a semiconductor packaging process.

FIG. 1 shows an example of such a conventional lead frame.

As shown in FIG. 1, a nickel thin intermediate layer 22 and an outermost protection layer 23 are sequentially stacked on a metal substrate 21 made of copper or a copper alloy.

The protection layer is made of either palladium (Pd) or a palladium alloy, and the nickel thin layer and the protection layer each are accomplished by electroplating using direct current (DC).

In the lead frame configured as described above, the intermediate layer 22 formed on the upper surface of the metal substrate 21 prevents solderability degradation caused by oxidation due to spreading of copper or iron in a metal substrate made of copper, a copper alloy, or an iron—nickel alloy up to the surface, and prevents copper oxide or sulfide from being generated. Also, the intermediate layer 22 protects the metal substrate 21 when the protection layer 23 made of palladium is cracked.

Since the protection layer made of palladium is formed on the upper surface of the intermediate layer as described above, when soldered, the palladium on the surface is fused, spreads into lead, and joins with the lead. Thus, an interface between the lead and nickel is accomplished, and the line of the intermediate layer is protected when the intermediate layer is cracked.

However, the protection layer of the lead frame is plated using a DC current method, so that the protection layer 23 cannot be formed to a uniform thickness on the surface as shown in FIG. 1. The reason for this relates to the nonuniform nuclear growth within a plating solution. That is, when a DC current is applied, ions unevenly spreading within the plating solution are moved to the metal surface and deposited. At this time, crystal growth occurs around a large nucleus, and a pin hole is generated between nuclei. Hydrogen ions permeate the pin hole and are captured, so that the plated surface is rough and the plated layer has a thin portion 23a as shown in FIG. 1. In particular, when a DC current is used, the shape of an electric double layer between the metal substrate 21 and the plating solution is a direct current regardless of the state of the metal substrate. Thus, a current is relatively concentrated at a protruded portion of the substrate surface. Accordingly, concentrated precipitation occurs on this portion, so that the surface of this portion is rougher than the surface of the metal substrate. When the electric double layer between the plating solution and the metal substrate gets larger, the nuclear growth becomes even more uneven since the ions move at different times. Thus, a local thickness deviation of the plated layer is generated.

If the plating thickness of the protection layer is reduced to 3 microinches or less because of such a problem, the passive layer cannot perform its function, and the intermediate layer and the lower metal substrate 21 are eroded or atoms are spread while the lead frame is bent or while a semiconductor is assembled. Therefore, wire bondability and solderabilty are degraded.

Furthermore, if the protection layer is 3 microinches or more thick, the manufacturing costs increase by 30% or more compared to when a conventional Ag plating is used. Thus, the above-described lead frame is not cost-competitive.

U.S. Pat. No. 5,510,197 discloses restrictions on the thicknesses of the protection layer and the intermediate layer formed on the upper surface of the metal substrate, and an embodiment of plating using vapor deposition among other physical deposition methods. As disclosed in the above document, an intermediate layer is formed of nickel or a nickel alloy to a thickness of 50 to 20000 Å on a base substrate made of copper or a copper alloy, and a protection layer is formed of gold, gold alloy, silver, silver alloy, palladium, or palladium alloy to a thickness of 10 to 500 Å on the intermediate layer by vapor deposition or ion sputtering. Such a structure results from the fact that if the thickness of the protection layer is 10 Å or less, solderability is not good, and if the thickness of the protection layer is 500 Å or more, the quality does not get any better, and the manufacturing costs increase.

In the lead frame as described above, the protection layer is formed by vapor deposition or ion sputtering being a physical deposition method. Thus, the lead frame is difficult to apply to a continuous production system, and its production cost increases.

SUMMARY OF THE INVENTION

To solve the above problems, it is an object of the present invention to provide a lead frame having a plated protection layer by applying a modulated current to improve corrosion resistance, solderability, and wire bondability, and a plating method thereof.

Accordingly, to achieve the above object, there is provided a lead frame comprising: a metal substrate; an intermediate layer formed on at least one side surface of the metal substrate; and a protection layer plated with at least one metal among palladium, palladium alloy, gold, gold alloy, silver, and silver alloy to a thickness of 0.01 to 1.5 microinches by applying a modulated current, formed on the upper surface of the intermediate layer.

Here, the waveform of the modulated current is a square wave having a pulse which is periodically applied or a square wave whose polarity is periodically inverted.

It is preferable that the intermediate layer is formed of nickel or nickel alloy.

According to another aspect of the present invention, a lead frame comprises: a metal substrate; an intermediate layer plated with at least one metal among nickel and nickel alloy by applying a modulated current, formed on at least one side surface of the metal substrate; and a protection layer plated with at least one metal among palladium, palladium alloy, gold, gold alloy, silver, and silver alloy to a thickness of 0.01 to 1.5 microinches by applying a modulated current, formed on the upper surface of the intermediate layer.

Here, the waveform of the modulated current applied to form the intermediate layer of the lead frame is a square wave whose polarity is periodically inverted.

To achieve the above object, there is provided a lead frame plating method comprising the steps of: (a) forming an intermediate layer on the upper surface of a metal substrate; (b) submerging the metal substrate into a plating solution; and (c) forming a passive layer to a thickness of 0.01 to 1.5 microinches on the upper surface of the intermediate layer by applying a modulated current to the plating solution and the metal substrate.

BRIEF DESCRIPTION OF THE DRAWINGS

The above objectives and advantage of the present invention will become more apparent by describing in detail a preferred embodiment thereof with reference to the attached drawings in which.

DESCRIPTION OF THE PREFERRED EMBODIMENT

Figure 1:
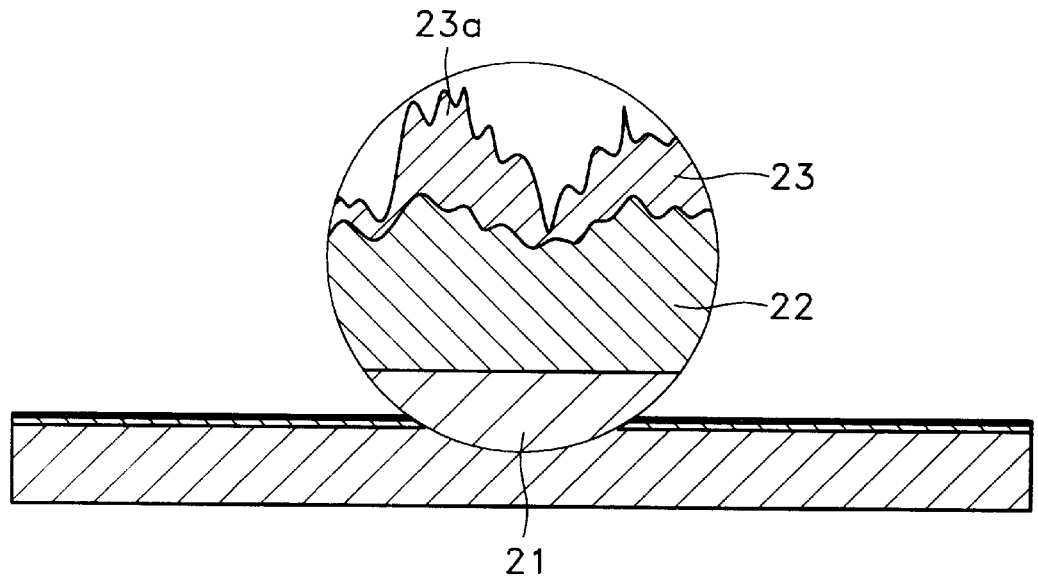
FIG. 1 is a cross-sectional view of a conventional lead frame.
Figure 2:
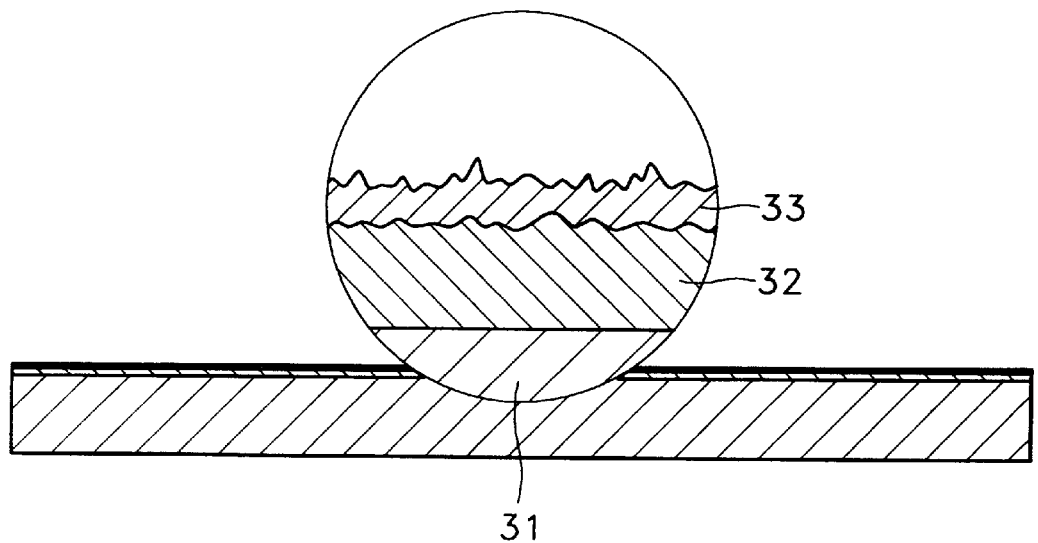
FIG. 2 is a cross-sectional view of a lead frame according to the present invention.

A preferred embodiment of a lead frame according to the present invention is shown in FIG. 2.

As shown in FIG. 2, an intermediate layer 32 is formed of nickel or nickel alloy on the upper surface of a metal substrate 31 made of copper, copper alloy, or iron—nickel-family alloy. A protection layer 33 is formed on the upper surface of the intermediate layer 32.

According to the present invention, the intermediate layer is formed by a plating method using a modulated current, and the protection layer 33 is formed to a thickness of 0.01 to 1.5 microinches by a plating method using a modulated current. The modulated current has a square waveform in which the current polarity is periodically converted or has a pulse which is periodically applied.

The protection layer is formed of at least one metal selected from the group consisting of palladium (Pd), palladium alloy, gold, gold alloy, and silver alloy.

Figure 3:
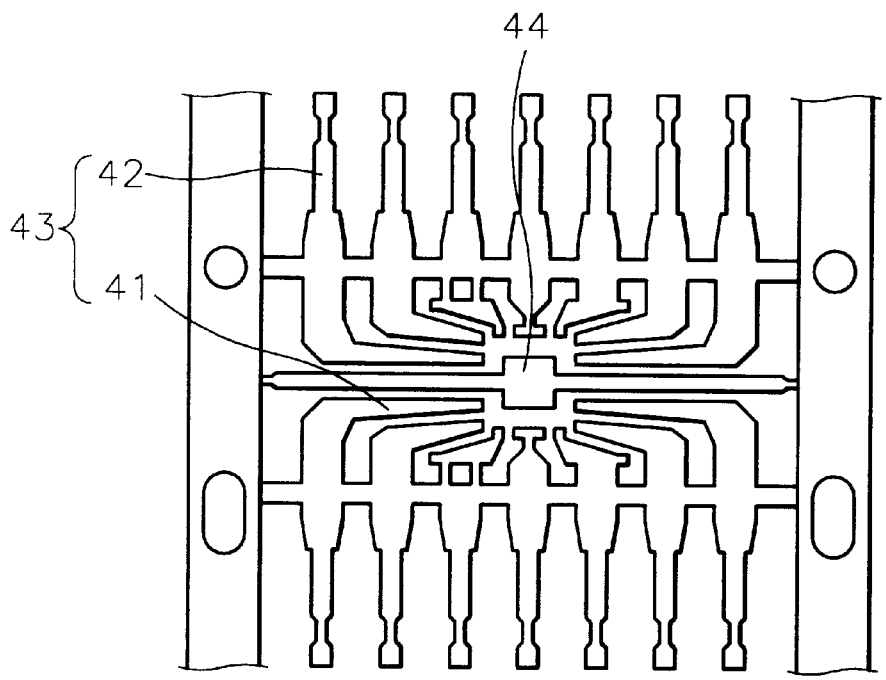
FIG. 3 is a plan view of a lead frame according to the present invention.

As shown in FIG. 3, the surface of the protection layer 33 formed by the modulated current has relatively fine and smooth roughness compared to a as conventional protection layer. Thus, even when the protection layer is thin, it can smoothly perform its function. According to an experiment made by the present inventor, it is preferable that the thickness of the protection layer is 0.01 to 1.5 microinches.

FIG. 3 shows an embodiment of a semiconductor package lead frame. The lead frame includes a lead frame main body 43 having a plurality of inner leads 41 which are wire bonded to a semiconductor chip and formed in a predetermined pattern and outer leads 42 which extend from the inner leads 41 and are connected to signal terminals of a circuit substrate.

A pad 44 can be further formed on the center surrounded by the inner leads 41 formed in a predetermined pattern. The intermediate layer 32 of FIG. 2 is formed on at least one side surface of the inner leads 41, the outer leads 42, and the pads 44, and the protection layer 33 of FIG. 2 is formed on the upper surface of the intermediate layer 32. The protection layer 33 is plated with a commonly known material to a thickness of 0.01 to 1.5 microinches.

According to the present invention, the intermediate layer 32 of nickel or nickel alloy and the protection layer 33 of palladium or palladium alloy are manufactured by a method in which a modulated current is applied, respectively on the upper surface of the lead frame main body or a metal substrate and the upper surface of the intermediate layer 32. This method improves the solderability of a plated layer as will be described later.

A lead frame plating method according to the present invention will now be described in more detail.

First, the intermediate layer 32 is formed of nickel or nickel alloy on the upper surface of the metal substrate 31 of FIG. 2. Here, it is preferable that the metal substrate is formed of copper, copper alloy, or iron—nickel-family alloy.

The metal substrate 31 having the intermediate layer 32 formed thereon is submerged into a plating solution. The plating solution depends on the protection layer 33 but can be a palladium plating solution or a palladium alloy plating solution. It is assumed that the material of the protection layer is not limited by the present invention.

A modulated current, i.e., a current having a waveform which is periodically inverted, is applied to the plating solution and the lead frame, and the protection layer 33 of a thickness of 0.01 to 1.5 microinches is plated on the upper surface of the intermediate layer 32.

Figure 4:
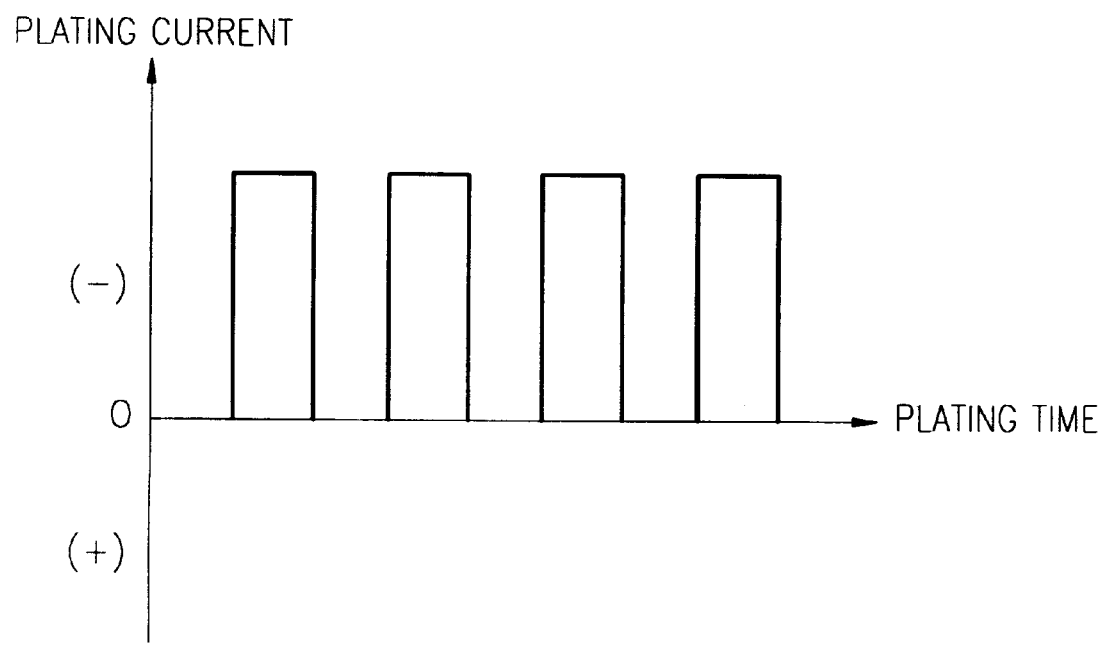
FIGS. 4 through 8 are graphs showing the waveform of a modulated current applied according to the present invention.
Figure 5:
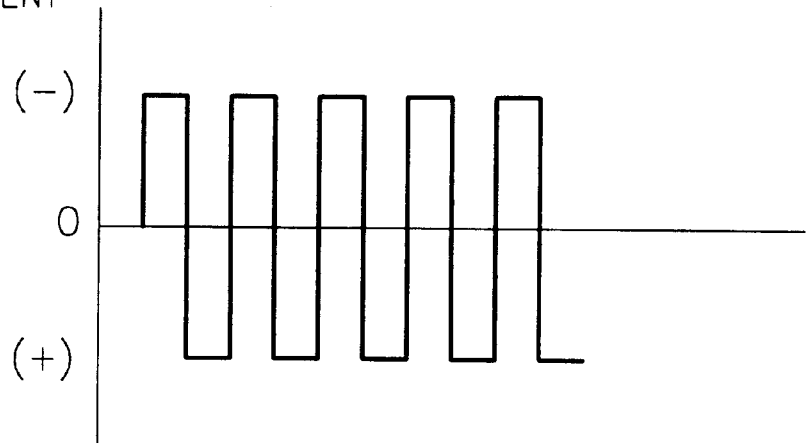
Figure 8:
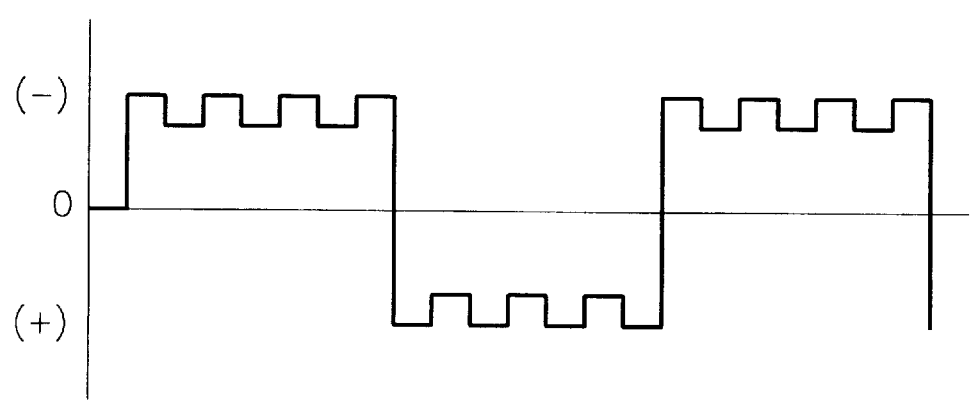

Examples of the waveform of the applied modulated current are shown in FIGS. 4 and 8. That is, the modulated current is a square wave current in which a pulse wave is periodically applied as shown in FIG. 4. Alternatively, the modulated current can be an inversion pulse square wave current whose polarity is periodically inverted as shown in FIG. 5.

Figure 6:
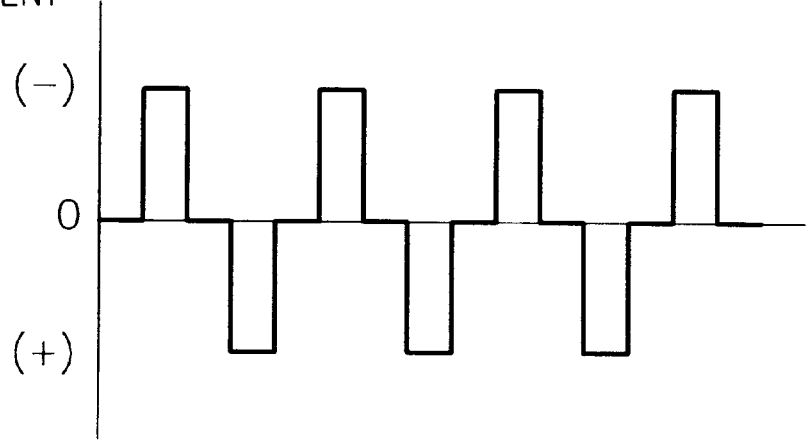
Figure 7:
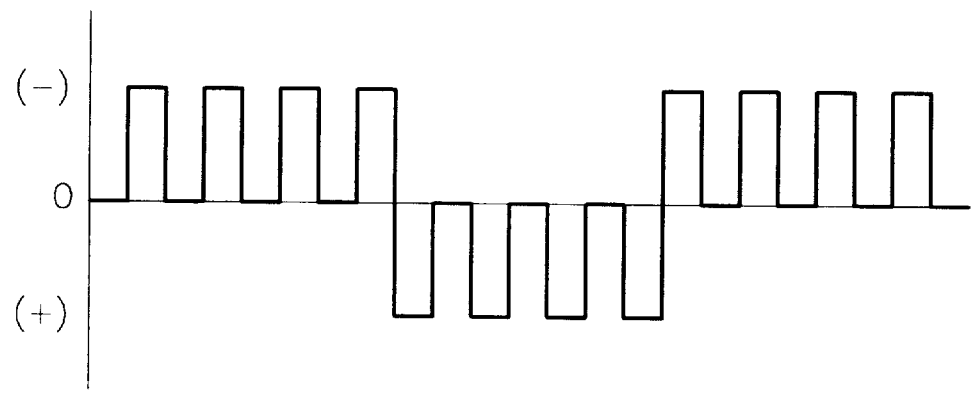

Also, the modulated current can have a square waveform in which a square wave is periodically inverted at predetermined time intervals as shown in FIG. 6. As shown in FIG. 7, the waveform of the modulated current has a unit period including first and second periods each having a plurality of square waves. The polarity of the square waves in the first period can be opposite to that of the square waves in the second period. Alternatively, the modulated current can have a square waveform in which the polarity of a square wave is periodically inverted as shown in FIG. 8, and have a predetermined direct current component.

Here, the frequency band of the modulated current is between 100 Hz and 50 KHz, the duty cycle is 5 to 50%, and the mean current density is 0.5 to 10 A/dm$^2$.

The intermediate layer 32 formed on the upper surface of the metal substrate 31 can be plated by applying the above-described modulated current. In this case, the waveform of the modulated current is the same as that for forming the protection layer. A modulated current having a frequency band of 50 to 500 Hz is used when the intermediate layer is plated. In this case, it is preferable that the duty cycle is between 35% and 85%, and the current density is 2 to 40 A/dm$^2$.

Figure 9:
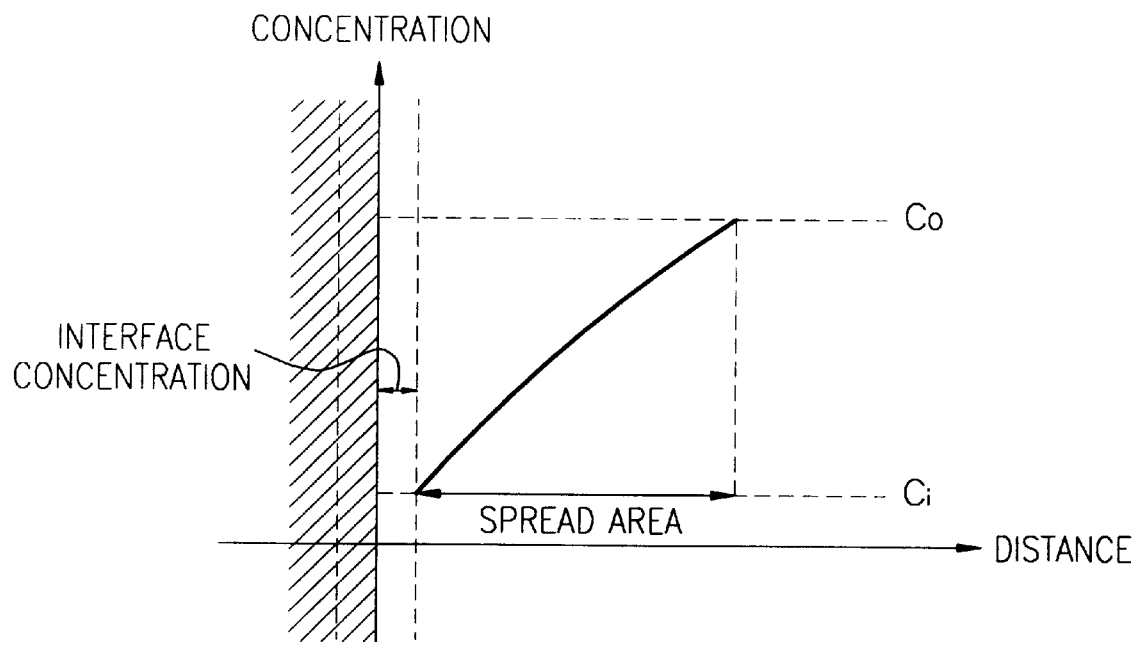
FIG. 9 is a graph showing concentration polarization within a plating solution.

However, as shown in FIG. 9, when the metal substrate 31 is submerged in the plating solution, the concentration of the surface of the metal substrate 31 is unevenly distributed according to distance. That is, the concentration of the plating solution changes from a lowest concentration (Ci) to a mean concentration (Co) as the plating solution becomes far from the surface of the metal substrate 31. Such an uneven distribution of concentration prevents the protection layer 33 from being smoothly formed.

Thus, the step of agitating the plating solution can be further comprised in the plating process in order to prevent the concentration polarization. The agitation of the plating solution is performed to facilitate movement of ions during the contact between the plating solution and the plating surface of the metal substrate when the intermediate layer 32 or the protection layer 33 is plated. This agitation can swirl the plating solution, move the metal substrate 31 at a speed of, for example, about 4 m/min within the plating solution, or spray the plating solution to the surface of the metal substrate 31. The agitation speed of the plating solution can be adjusted according to the change in the frequency of the modulated current.

The effect of the present invention can be more accurately understood by the following Experiments.

Experiment 1

A sample of the present invention, and first and second comparative examples are compared with each other in this experiment. In the sample according to the present invention, a 32-microinch intermediate layer is formed on a metal substrate, and a 1.5-microinch protection layer is formed on the intermediate layer by a modulated current. In the first comparative example, a 58microinch intermediate layer and a 3.3-microinch protection layer are formed on a metal substrate. In the second comparative example, a 110-microinch intermediate layer and a 6.5-microinch protection layer are formed on a metal substrate. The first and second comparative examples are manufactured by a conventional DC current plating method.

Figure 10:
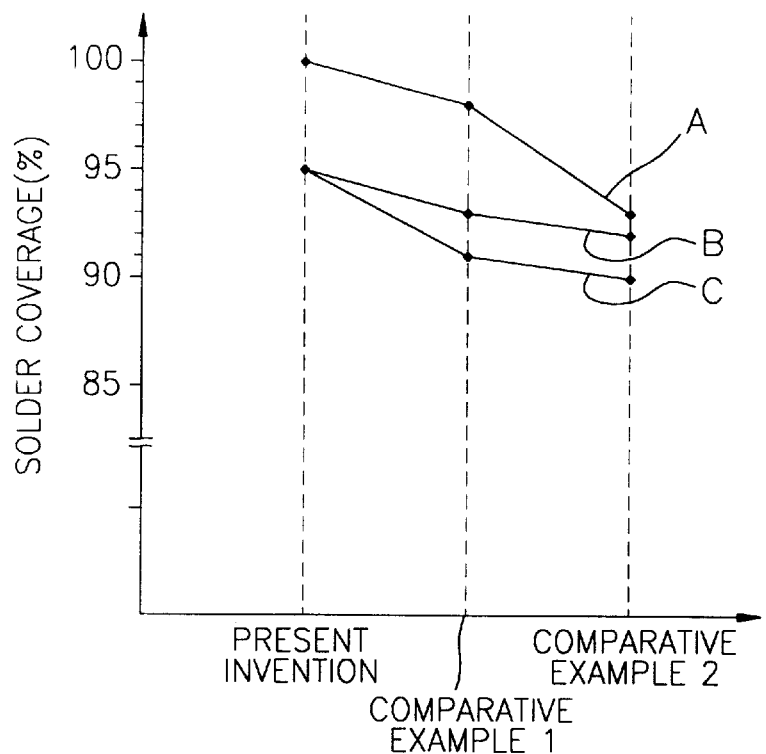
FIG. 10 is a graph showing solderability according to an experimental example of the present invention.

FIG. 10 shows the results of the three sample experiments under different steam aging and oven curing conditions.

After the three samples are steam-aged for 16 hours at 95° C., the solder coverage of the sample according to present invention is 100%, but the solder coverages of the first and second comparative examples are respectively 95% and 93%, as shown in graph A of FIG. 10.

As shown in graph B of FIG. 10, after the three samples are cured for two hours at 210° C. using an oven, the solder coverage of the sample according to present invention is 95%, but the solder coverages of the first and second comparative examples are respectively 93% and 92%.

As shown in graph C of FIG. 10, after the three samples are steam-aged for 24 hours at 95° C., the solder coverage of the sample according to present invention is still 95%, but the solder coverages of the first and second comparative examples are lowered respectively to 91% and 90%.

Experiment 2

Figure 11:
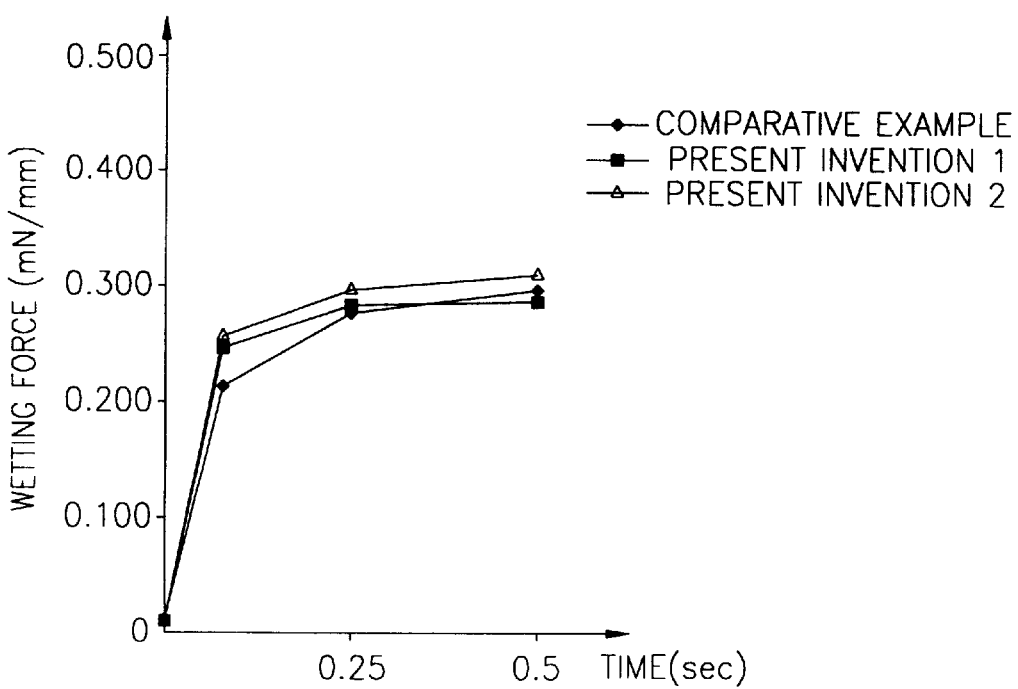
FIGS. 11 through 13 are graphs showing wettability according to another experimental example of the present invention.
Figure 12:
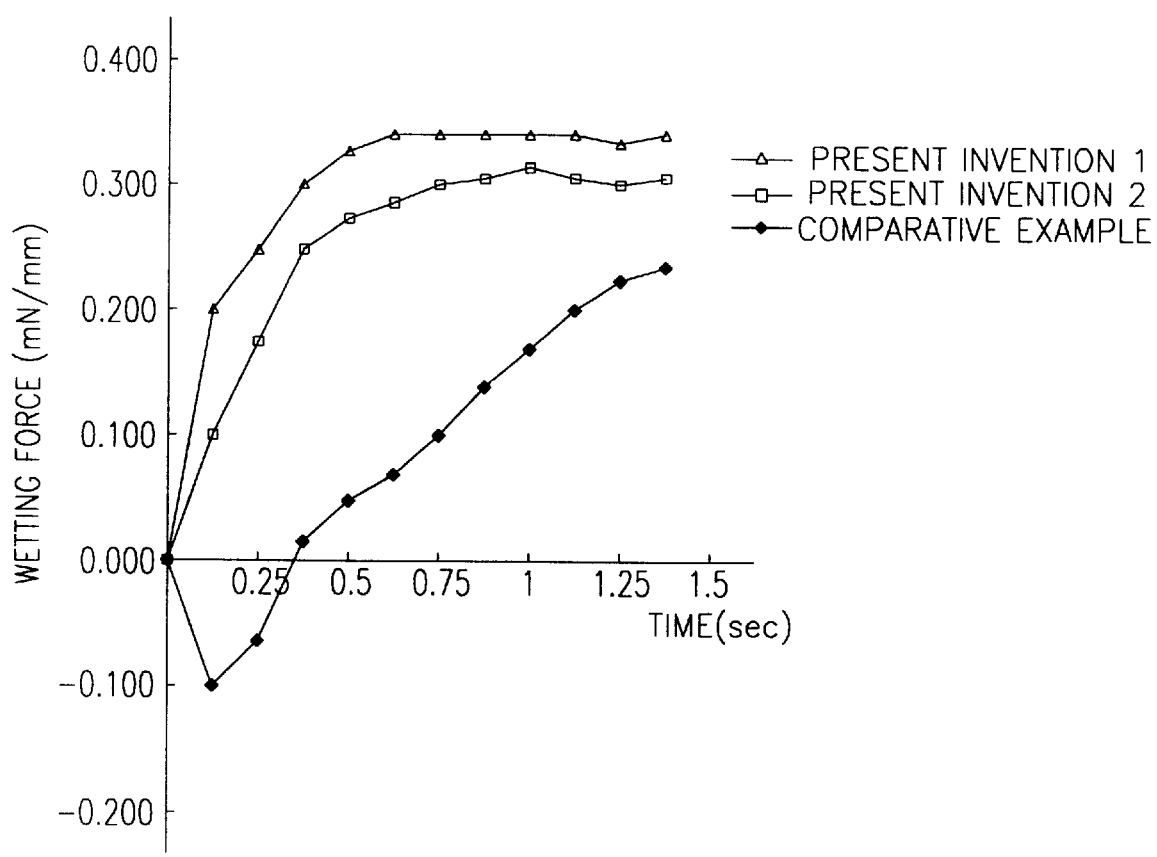

This experiment uses a first present invention having a palladium protection layer with 0.1 microinch thickness plated by a modulated current, and a second present invention having a palladium protection layer with 0.5 microinch thickness. A sample having a 4.0-microinch palladium protection layer formed by a conventional DC current method is manufactured as a comparative example. FIGS. 11 through 12 show the results of the wetting forces of the three samples each steam-aged for 16 hours at 95° C. Here, FIG. 12 shows the results of 8-hour steam aging at 95° C. The wetting force is a force measured when a plated lead is pulled out of a Pb—Sn solution having a temperature of about 245° C. after being perpendicularly put into it to about 0.5mm.

As shown in the above drawings, the wetting force is improved as the steam aging time increases, and it becomes evident that the sample according to the present invention has an excellent wetting force compared to the conventional comparative examples within about 0.5 sec. High temperature thermal treatment is performed for a short time of 0.5 sec or less in a typical semiconductor assembling process, so as to confirm that the sample according to the present invention has an excellent wetting force under this condition. The adhesion between a lead frame and lead is improved with an increase in the wetting force.

Figure 13:
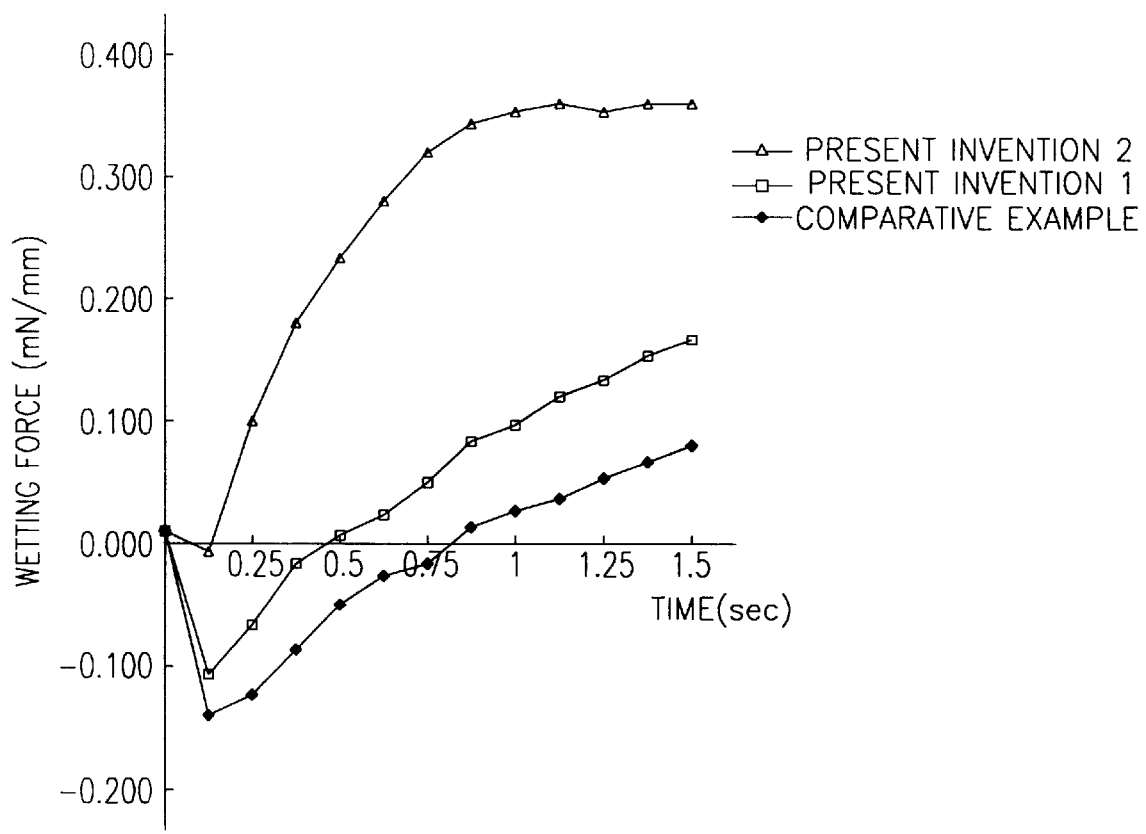

FIG. 13 shows the results of a wetting force measured after curing the above first and second present inventions and the comparative for 24 hours at 175° C. in an oven and then steam-aging it for 8 hours at 95° C.

It becomes evident that the wetting force increases when the passive layer is thin under the above-described condition.

According to the semiconductor package lead frame and the lead frame plating method as described above, a protection layer can be formed to be relatively thin, i.e., to a thickness of 0.01 to 1.5 microinches by applying a pulse current whose polarity is periodically inverted when plating the lead frame. Also, the roughness of the lead frame surface is not bad, so that solderability is improved.

The lead frame plating method and device according to the present invention were described referring to an embodiment shown in the drawings. However, the embodiment is just an example, and it will be understood by those skilled in the art that various modifications and other embodiments may be effected. Thus, a true technical protection scope of the present invention must be determined by the technical spirit of the attached claims.

What is claimed is:

1. A lead frame comprising:

a metal substrate;

an intermediate layer formed on at least one side surface of the metal substrate; and a protection layer plated with at least one metal among palladium, palladium alloy, gold, gold alloy, silver, and silver alloy to a thickness of 0.01 to 1.5 microinches by applying a modulated current, formed on the upper surface of the intermediate layer.

2. The lead frame as claimed in claim 1, wherein the waveform of the modulated current is a square wave whose polarity is periodically inverted.

3. The lead frame as claimed in claim 2, wherein the waveform of the modulated current has a predetermined direct current component.

4. The lead frame as claimed in claim 1 wherein the modulated current has a frequency band of between 100 Hz and 50 KHz and a duty cycle of between 5% and 50%.

5. The lead frame as claimed in claim 1, wherein the intermediate layer is formed of nickel or nickel alloy.

6. A lead frame plating method comprising the steps of:

(a) forming an intermediate layer on the upper surface of a metal substrate;

(b) performing at least one of submerging the metal substrate into a plating solution and spraying the plating solution to the metal substrate; and (c) forming a passive layer to a thickness of 0.01 to 1.5 microinches on the upper surface of the intermediate layer by applying a modulated current to the plating solution and the metal substrate.

7. The lead frame plating method as claimed in claim 6, wherein the protection layer is formed of at least one metal selected from the group consisting of palladium, palladium alloy, gold, gold alloy, silver, and silver alloy.

8. The lead frame plating method as claimed in claim 7, wherein the intermediate layer is formed of nickel or nickel alloy.

9. The lead frame plating method as claimed in claim 6, wherein the waveform of the modulated current is a square wave whose polarity is periodically inverted.

10. The lead frame plating method as claimed in claim 6, wherein the modulated current has a frequency band of between 100 Hz and 50 KHz and a duty cycle of between 5% and 50%.

11. The lead frame plating method as claimed in claim 6, wherein the step (a) is comprised of applying a modulated current to the plating solution and the metal substrate, the modulated current having a square wave whose polarity is periodically inverted.

12. The lead frame plating method as claimed in claim 11, wherein the modulated current has a frequency band of between 50 Hz and 500 Hz and a duty cycle of between 35% and 85%.

13. The lead frame as claimed in claim 2, wherein the modulated current has a frequency band of between 100 Hz and 50 KHz and a duty cycle of between 5% and 50%.

14. The lead frame as claimed in claim 3, wherein the modulated current has a frequency band of between 100 Hz and 50 KHz and a duty cycle of between 5% and 50%.

15. The lead frame plating method as claimed in claim 7, wherein the modulated current has a frequency band of between 100 Hz and 50 KHz and a duty cycle of between 5% and 50%.

16. The lead frame plating method as claimed in claim 8, wherein the modulated current has a frequency band of between 100 Hz and 50 KHz and a duty cycle of between 5% and 50%.

17. The lead frame plating method as claimed in claim 9, wherein the modulated current has a frequency band of between 100 Hz and 50 KHz and a duty cycle of between 5% and 50%.

* * * * *